(12) United States Patent
Nagadomi et al.

(10) Patent No.: US 8,156,393 B2
(45) Date of Patent: Apr. 10, 2012

(54) MEMORY SYSTEM

(75) Inventors: Yasushi Nagadomi, Yokohama (JP);
Daisaburo Takashima, Yokohama (JP);
Kosuke Hatsuda, Minato-Ku (JP);
Shinichi Kanno, Minato-Ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 152 days.

(21) Appl. No.: 12/513,860

(22) PCT Filed: Nov. 28, 2007

(86) PCT No.: PCT/JP2007/072898
§ 371 (c)(1),
(2), (4) Date: May 7, 2009

(87) PCT Pub. No.: WO2008/066058
PCT Pub. Date: Jun. 5, 2008

(65) Prior Publication Data
US 2010/0011260 A1    Jan. 14, 2010

(30) Foreign Application Priority Data

Nov. 30, 2006  (JP) .................... 2006-322868

(51) Int. Cl.
*G11C 29/00*  (2006.01)
(52) U.S. Cl. ............ 714/723; 714/2; 714/3; 714/6.12; 714/42; 714/710; 714/718; 714/742; 711/102; 711/103; 711/107; 365/185.01; 365/185.09; 365/200; 365/201
(58) Field of Classification Search ............ None
See application file for complete search history.

(56) References Cited

U.S. PATENT DOCUMENTS

| | | | |
|---|---|---|---|
| 6,078,520 A * | 6/2000 | Tobita et al. | 365/185.09 |
| 6,249,838 B1 * | 6/2001 | Kon | 711/103 |
| 6,426,898 B1 | 7/2002 | Mihnea et al. | |
| 6,993,690 B1 * | 1/2006 | Okamoto | 714/718 |
| 7,512,847 B2 * | 3/2009 | Bychkov et al. | 714/723 |
| 7,653,778 B2 * | 1/2010 | Merry et al. | 711/103 |
| 2002/0091965 A1 * | 7/2002 | Moshayedi | 714/8 |

(Continued)

FOREIGN PATENT DOCUMENTS

JP    2000 181805    6/2000

(Continued)

OTHER PUBLICATIONS

U.S. Appl. No. 12/713,631, filed Feb. 26, 2010, Fukutomi, et al.

(Continued)

*Primary Examiner* — John Trimmings
(74) *Attorney, Agent, or Firm* — Oblon, Spivak, McClelland, Maier & Neustadt, L.L.P.

(57) ABSTRACT

To provide a memory system which determines a memory state such as an exhaustion level and allows a memory to be efficiently used.

The memory system includes a NAND type flash memory 1 in which data can be electrically written/erased, a nonvolatile memory 2 which counts the number of erase operations of the NAND type flash memory 1 and retains the number of erase operations and a maximum number of erase operations, and a controller 3 which has a connection interface 31 to be given a self-diagnosis command from a computer 4, and retrieves the number of erase operations and the maximum number of erase operations from the nonvolatile memory 2 based on the self-diagnosis command and outputs the number of erase operations and the maximum number of erase operations to the computer 4 through the connection interface 31.

18 Claims, 11 Drawing Sheets

U.S. PATENT DOCUMENTS

| | | | |
|---|---|---|---|
| 2003/0078741 A1 | 4/2003 | Storino | |
| 2003/0217323 A1 | 11/2003 | Guterman et al. | |
| 2004/0158775 A1 | 8/2004 | Shibuya et al. | |
| 2006/0265545 A1* | 11/2006 | Entani | 711/103 |
| 2007/0266200 A1* | 11/2007 | Gorobets et al. | 711/103 |
| 2008/0126679 A1* | 5/2008 | Philipps | 711/103 |
| 2008/0162079 A1* | 7/2008 | Astigarraga et al. | 702/182 |

FOREIGN PATENT DOCUMENTS

| | | | |
|---|---|---|---|
| JP | 2001 195316 | | 7/2001 |
| JP | 2001-195316 | * | 7/2001 |
| JP | 2003 216506 | | 7/2003 |
| JP | 2004 234052 | | 8/2004 |
| WO | WO 2006/005661 A1 | | 1/2006 |

OTHER PUBLICATIONS

U.S. Appl. No. 12/393,654, filed Feb. 26, 2009, Fukutomi, et al.
U.S. Appl. No. 12/396,006, filed Mar. 2, 2009, Sato, et al.
U.S. Appl. No. 12/395,811, filed Mar. 2, 2009, Fukutomi, et al.
U.S. Appl. No. 12/398,608, filed Mar. 5, 2009, Fukutomi, et al.
U.S. Appl. No. 12/555,274, filed Sep. 8, 2009, Kanno, et al.
U.S. Appl. No. 12/566,236, filed Sep. 24, 2009, Yano, et al.
Korean Office Action issued Nov. 23, 2010, in Patent Application No. 10-2009-7011144 (with English-language translation).
Chinese Office Action with English translation issued on Jan. 26, 2011 in corresponding Chinese Application No. 200780042552.7 filed Nov. 28, 2007.
Office Action issued Sep. 8, 2011, in Taiwanese Patent Application No. 096145749 (with English-language translation).

* cited by examiner

DISPLAY EXAMPLE OF EXHAUSTION LEVEL OF MEMORY SYSTEM $\begin{bmatrix} \text{INFORMATION FROM} \\ \text{MEMORY SYSTEM} \end{bmatrix}$  $\begin{bmatrix} \text{EXHAUSTION LEVEL,} \\ \text{REMAINING AMOUNT OF WRITING} \end{bmatrix}$ TOTAL AMOUNT = 31.8TB
OF Writing
TOTAL AMOUNT = 300TB
OF Reading
LIMITING AMOUNT = 32TB
OF Writing

⇨ EXHAUSTION = (31.6TB+300/10⁴TB)/32TB
LEVEL = 99%

REMAINING = 32TB−31.6TB−300/10⁴TB
AMOUNT ≒370GB
OF Writing

IF EXHAUSTION LEVEL IS GREATER THAN OR EQUAL TO
99%, REMAINING AMOUNT OF Writing IS DISPLAYED AS BELOW,
AND BACKUP IS RECOMMENDED

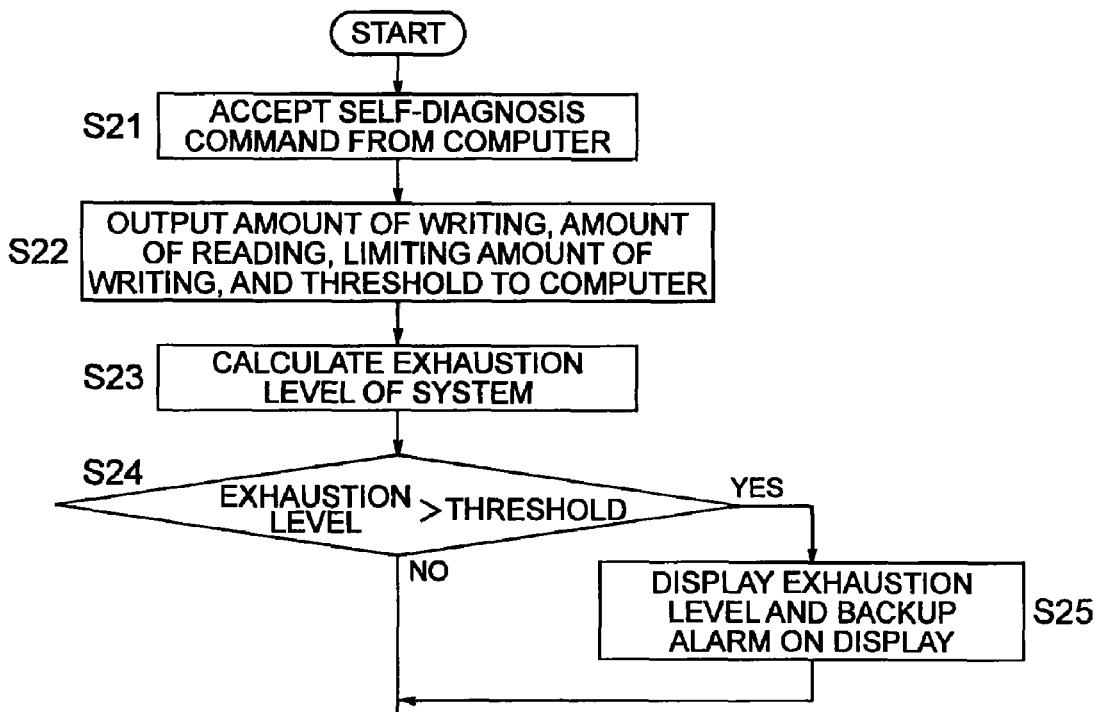

ONLY 370 GB CAN BE WRITTEN
IN THIS DEVICE !!
WARNING: BACK UP DATA
IMMEDIATELY, AND
REPLACE DEVIC
EXHAUSTION LEVEL OF
MEMORY SYSTEM: 99%
99%

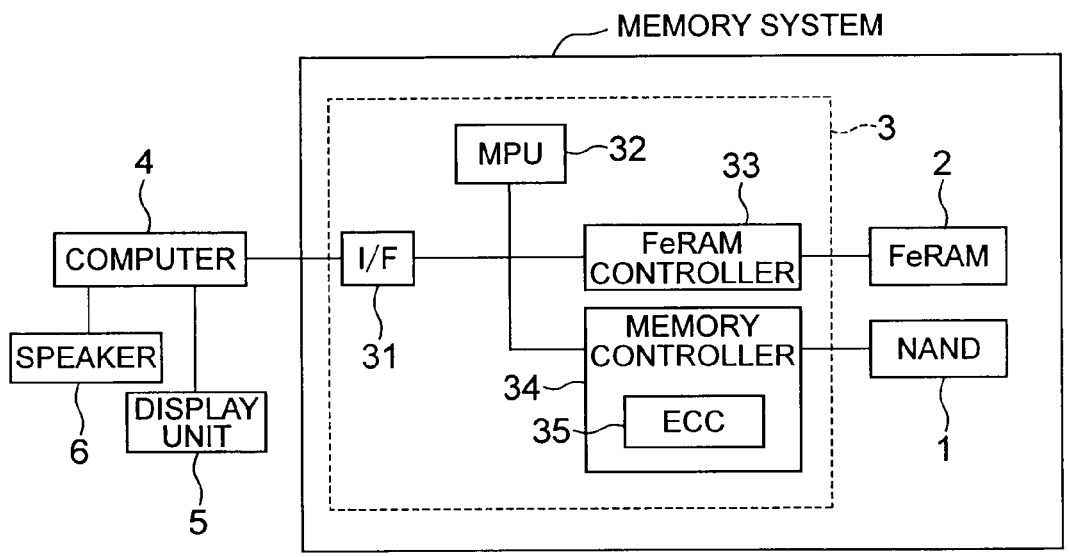
FIG. 13
DISPLAY EXAMPLE OF EXHAUSTION
LEVEL OF MEMORY SYSTEM
(a) EXHAUSTION LEVEL>
THRESHOLD && THE NUMBER
OF ERROR bits>THRESHOLD
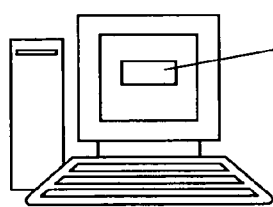
EXHAUSTION LEVEL OF
MEMORY SYSTEM:90%
MANY READING ERRORS HAVE
OCCURRED IN DEVICE
WARNING:PERFORM BACKUP
IMMEDIATELY
90%
(b) EXHAUSTION LEVEL>
THRESHOLD
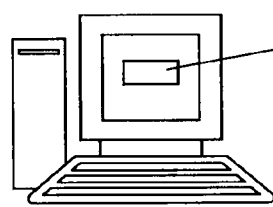
EXHAUSTION LEVEL OF
MEMORY SYSTEM:90%
WARNING:PERFORM BACKUP
90%
FIG. 14

MEMORY SYSTEM

TECHNICAL FIELD

The present invention relates to a memory system.

BACKGROUND ART

In recent years, semiconductor memories have been used in various areas such as a main storage of a large-scale computer, a personal computer, a home electric appliance, a mobile phone, and the like. Particularly, a flash memory has such characteristics that data is not erased even if it is powered off, and it has a structure suitable for high integration, and used in information apparatuses such as a mobile phone and a digital camera.

Types of Flash EEPROM nonvolatile memory are mainly an NOR type and an NAND type. As for the NOR type, a read rate is high, the number of read operations is about $10^{13}$, and it is used as an instruction code storage. However, the NOR type has a small effective bandwidth for writing, and therefore not suitable for file recording. As for the NAND type, although an access rate is low compared to the NOR type, high integration is allowed, a large number of bits can be stored or erased at the same time is large, and written data can be captured in burst and programming is allowed in page units having many bits. Therefore, the NAND type memory has a large effective bandwidth, and is used for a memory card, a USB memory, a memory of a mobile phone, a memory of a portable music player, and the like. Recently, it is also considered as a replacement of a hard disk (hereinafter referred to as an HDD).

One problem in a case where the NAND type flash memory is as a replacement of an HDD is a problem of system lifetime. An HDD is equipped with a Self-Monitoring, Analysis and Reporting Technology (commonly known as SMART), which is a self-diagnosis function intended for early detection of a failure of the HDD itself and failure prediction, and thereby can notify a user of failure rate. Many of currently manufactured HDDs have this SMART, and predict a failure rate from items including a temperature, an operating time, a spin-up time, the number of alternate sectors (spare areas in which a sector causing bad data is arranged), and the like.

If an NAND type flash memory is also considered to need reliability equivalent to HDDs, it requires a self-diagnosis function like SMART. However, reason of failure in the NAND type flash memory is different from that of the HDDs. Due to characteristics of recoding media of HDDs, they have no limit on the number of write operations, but is susceptible to heat. Further, since they are machine components, there is a problem of aged deterioration of mechanical operation. On the other hand, the NAND type flash memory has little machine components, but consideration should be given to a failure caused by bad data due to an excessive number of store/erase operations. Therefore, a new criterion of system lifetime is needed in consideration of the number of store/erase operations specific to the NAND type flash memory.

A limit on the number of store/erase operations of the NAND type flash memory will be described. For writing (storing/erasing) in a flash memory, high voltage is applied between a substrate and a gate such that electrons are injected and released into a floating gate. If this is performed many times, gate oxide film around the floating gate is deteriorated, and if it is left as is for a long time, the electrons injected into the floating gate get out therefrom, and data is destroyed. In other words, as the number of write operations increases, retention characteristics degrade. The number of write operations of current flash memories is about $10^5$, which is less than that of other nonvolatile memories. Therefore, if it is used as a replacement of an HDD, it is considered that data may be destroyed due to the limit of the number of store/erase operations, causing a trouble of the system. As a measure against such a limit on the number of store/erase operations, wear leveling is performed in which the number of erase operations is counted and a threshold value is set for each block, and physical address translation is performed between a block whose number of erase operations is large and a block whose number of erase operations is small, so that the numbers of store/erase operations are averaged.

Limit on the number of store/erase operations affects not only writing but also reading. During reading from the NAND type flash memory, high voltage is repeatedly applied to a non-selected cell (in view of block units, all pages except a target to be read), causing read disturb in which electrons enter in the floating gate through the gate oxide film and thus change a threshold voltage of a cell so that data is destroyed. In addition, during use, the gate oxide film is degraded due to storing/erasing, and accordingly read disturb occurs more frequently. Recently, NAND type flash memories have been developed to have more advanced multivalued memorization in which more than one bit information is stored in one cell, and therefore the effect of the read disturb seems to be larger. To prevent such read disturb, it is required to perform rewriting in (refresh) a block whose number of read operations is large so as to return a threshold voltage to its original state, which affects the number of store/erase operations.

There has been proposed a storage device which determines a memory state of a flash memory or the like, including: a memory having a main memory area and a spare memory area; display means; and processing means, wherein, when the number of rewrite operations in each address of the main memory area reaches a specified number, information stored in the address is transferred to the spare memory area; and when a remaining capacity of the spare memory area reaches a specified remaining capacity, the display means is driven to notify an operator or the like of a time to replace the memory (see, for example, Japanese Patent Laid-Open No. 2000-181805). However, in such a storage device, an end of memory lifetime for writing is determined to be reached and the memory is replaced in a state where the number of write operations in the spare memory area is still small. Therefore, the memory cannot be efficiently used.

DISCLOSURE OF THE INVENTION

Problems to be Solved by the Invention

An object of the present invention is to provide a memory system which determines a memory state such as an exhaustion level and allows a memory to be efficiently used.

Means for Solving the Problems

A memory system according to one aspect of the present invention includes: a first memory in which data can be electrically written/erased; a second memory which counts the number of erase operations of the first memory and retains the number of erase operations and a maximum number of erase operations of the first memory; and a controller which is connected to be given a self-diagnosis command from an outside through a connection interface, and which retrieves the number of erase operations and the maximum number of erase operations from the second memory based on the self-diagnosis command and outputs the number of erase operations and the maximum number of erase operations to the outside through the connection interface.

Further, a memory system according to one aspect of the present invention includes: a first memory in which data can be electrically written/erased; a second memory which monitors an amount of writing and an amount of reading with respect to the first memory, and retains the amount of writing, the amount of reading, and a limiting amount of writing based on a capacity of the first memory and a limiting number of write operations; and a controller which is connected to be given a self-diagnosis command from an outside through a connection interface, and which retrieves the amount of writing, the amount of reading, and the limiting amount of writing from the second memory based on the self-diagnosis command and outputs the amount of writing, the amount of reading, and the limiting amount of writing to the outside through the connection interface.

ADVANTAGES OF THE INVENTION

According to the present invention, a memory state such as an exhaustion level can be determined, and a memory can be efficiently used.

BRIEF DESCRIPTION OF THE DRAWINGS

FIG. 11 is a diagram which shows one example of backup alarm display;

FIG. 12 is a diagram which shows a flow of exhaustion level calculation and notification to a user;

FIG. 13 is a schematic configuration diagram of a memory system according to a fourth embodiment of the present invention;

FIG. 14 is a diagram which shows one example of backup alarm display;

BEST MODE FOR CARRYING OUT THE INVENTION

Hereinafter, a memory system according to embodiments of the present invention will be described based on the drawings.

First Embodiment

Figure 1:
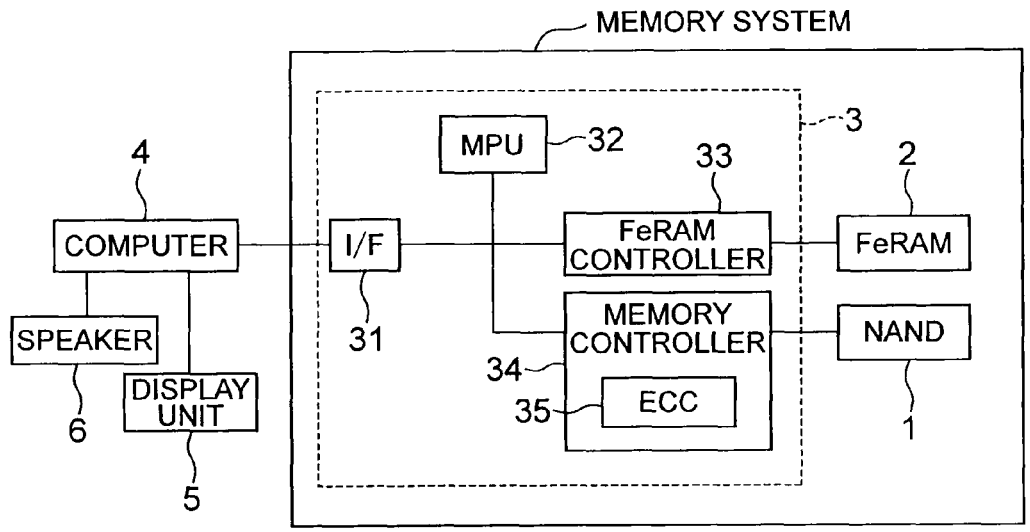
FIG. 1 is a schematic configuration diagram of a memory system according to a first embodiment of the present invention.

FIG. 1 shows a schematic configuration of a memory system according to the first embodiment of the present invention. The memory system includes an NAND type flash memory 1, a nonvolatile memory (FeRAM) 2, and a controller 3. The memory system is connected to a computer 4 through a connection interface 31 included in the controller 3. A display unit (display) 5 and a speaker 6 are connected to the computer 4.

The FeRAM 2 has a counter (not shown), and for wear leveling, counts the number of erase operations in each block of the NAND type flash memory 1 as well as retaining a total of the number of erase operations. In addition, it retains a maximum number of erase operations and a threshold of exhaustion level of the NAND type flash memory 1. The exhaustion level will be described later. The maximum number of erase operations is obtained here from (limiting number of store/erase operations in each block of the NAND type flash memory 1)×(total number of blocks of the NAND type flash memory 1). In addition, FeRAM 2 also has a function as a cache for high-speed reading/writing of the NAND type flash memory 1.

The controller 3 has the connection interface 31, a processing unit (MPU) 32, a FeRAM controller 33, and a memory controller 34. The FeRAM controller 33 controls transferring data retained by the FeRAM 2, and the memory controller 34 controls transferring data to the NAND type flash memory 1. In addition, the memory controller 34 includes an error correction circuit (ECC) 35. When an incorrect value is stored in the NAND type flash memory 1, the memory controller 34 can detect this error and correct it to a correct value. In the NAND type flash memory 1, wear leveling is performed such that the number of store/erase operations in each block is averaged.

Figure 2:
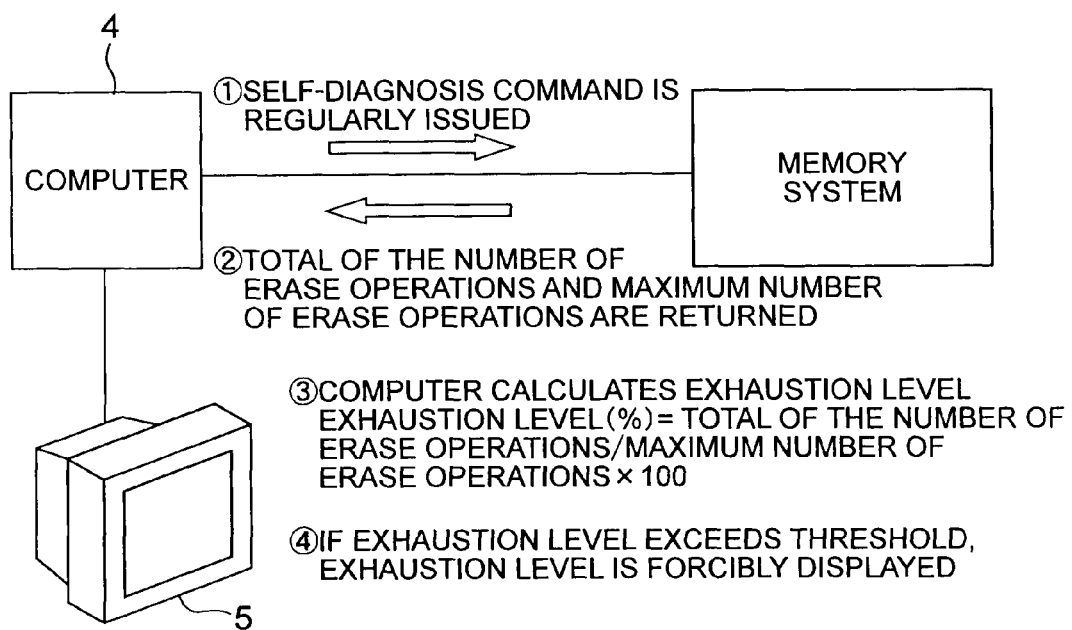
FIG. 2 is a diagram which illustrates operations of each unit associated with exhaustion level calculation and alarm notification.
Figure 3:
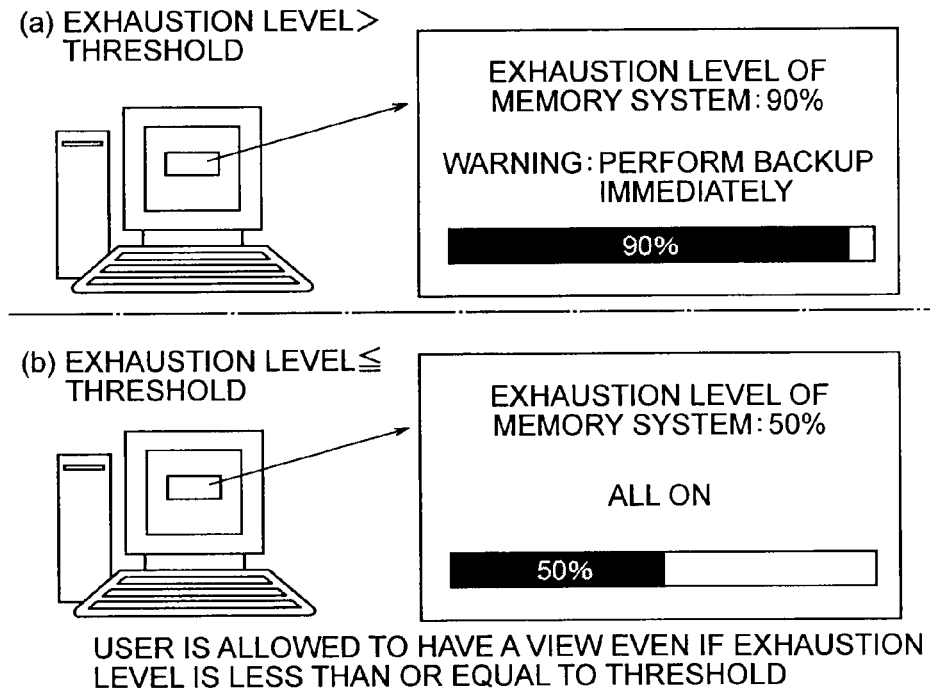
FIG. 3 is a diagram which shows one example of backup alarm display.

As shown in FIG. 2, a self-diagnosis command is regularly issued from the computer 4 to this memory system. The processing unit 32 receives the self-diagnosis command through the connection interface 31, and performs control to output a total of the number of erase operations, a maximum number of erase operations, and a threshold of exhaustion level which are retained by the FeRAM 2 to the computer 4 through the connection interface 31. The computer 4 calculates an exhaustion level of the NAND type flash memory 1 based on the total of the number of erase operations and the maximum number of erase operations. The exhaustion level is a ratio of the total of the number of erase operations to the maximum number of erase operations. If this exhaustion level is greater than or equal to the threshold, the exhaustion level and a backup alarm are displayed on the display unit 5 as shown in FIG. 3(*a*) so that a user is notified of them. The exhaustion level is calculated and displayed in percentage here. In addition, an alarm sound is emitted from the speaker 6 to give notification to the user. In addition, the user can optionally display the exhaustion level on the display unit 5. If the exhaustion level is less than or equal to the threshold, the exhaustion level is displayed as shown in FIG. 3(b). Of course, various representations may be used as a notification to a user. For example, it goes without saying that a circle graph, a line graph, various words and colors, and other indications can be used.

Figure 4:
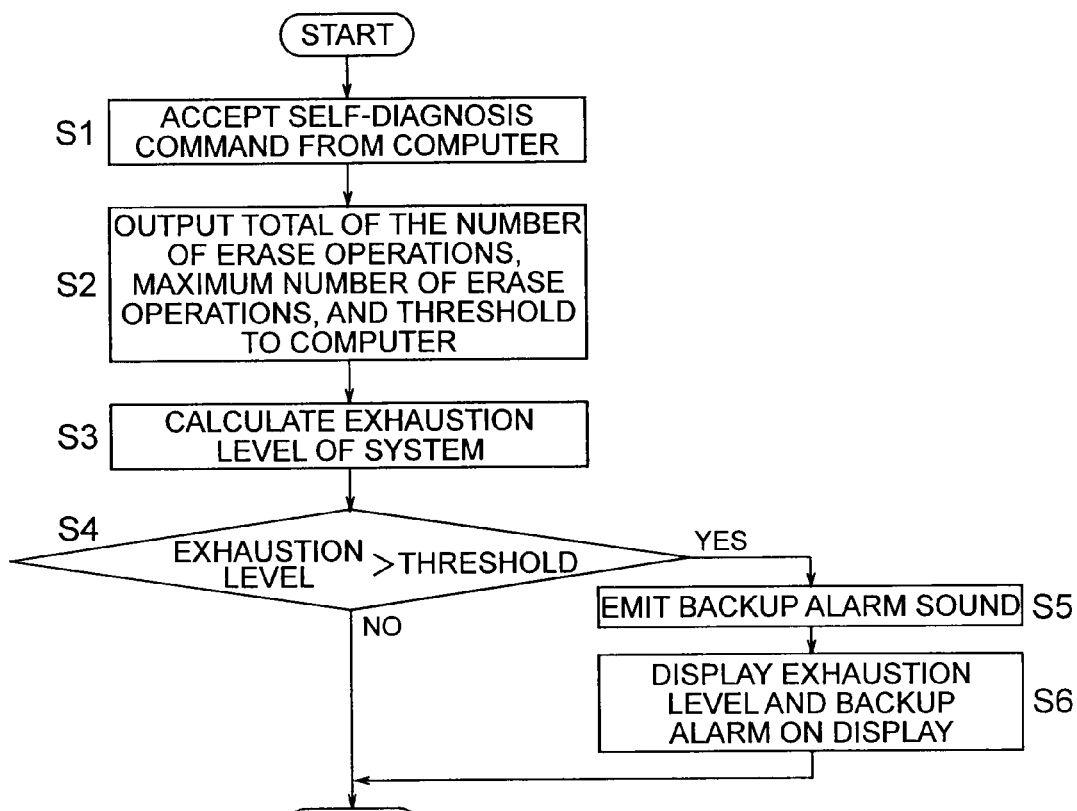
FIG. 4 is a diagram which shows a flow of exhaustion level calculation and notification to a user.

FIG. 4 shows a process flow of calculation of an exhaustion level of the NAND type flash memory 1 and notification of the exhaustion level to a user.

(Step S1) The processing unit 32 accepts a self-diagnosis command issued by the computer 4.

(Step S2) A total of the number of erase operations, the maximum number of erase operations, and a threshold of exhaustion level are retrieved from the FeRAM 2 and outputted to the computer 4.

(Step S3) The exhaustion level is calculated by the computer 4.

(Step S4) Whether or not the calculated exhaustion level is greater than the threshold is determined. If it is less than or equal to the threshold, the process is terminated. If it is greater than the threshold, the process proceeds to step S5.

(Step S5) A backup alarm sound is emitted from the speaker 6.

(Step S6) The exhaustion level and a backup alarm are displayed on the display unit 5. The step S5 of emitting an alarm sound and the step S6 of displaying an alarm may be replaced with each other.

In the above description, the exhaustion level is calculated from the total of the number of erase operations. However, since the number of erase operations in each block is averaged by wear leveling, an exhaustion level may be calculated from the number of erase operations in each block and a maximum number of erase operations.

In the NAND type flash memory 1, the numbers of rewrite operations are evenly distributed among blocks by wear leveling so that the number of rewrite operations with respect to a whole memory area is increased. A notification of an exhaustion level of the NAND type flash memory 1 can be provided to a user at any time. Backup is recommended when the exhaustion level exceeds a predetermined threshold and comes close to the end of a system lifetime, so that data loss can be prevented before it happens.

As described above, according to the memory system of the first embodiment, a memory state such as an exhaustion level can be determined, and a memory can be efficiently used.

Second Embodiment

Figure 5:
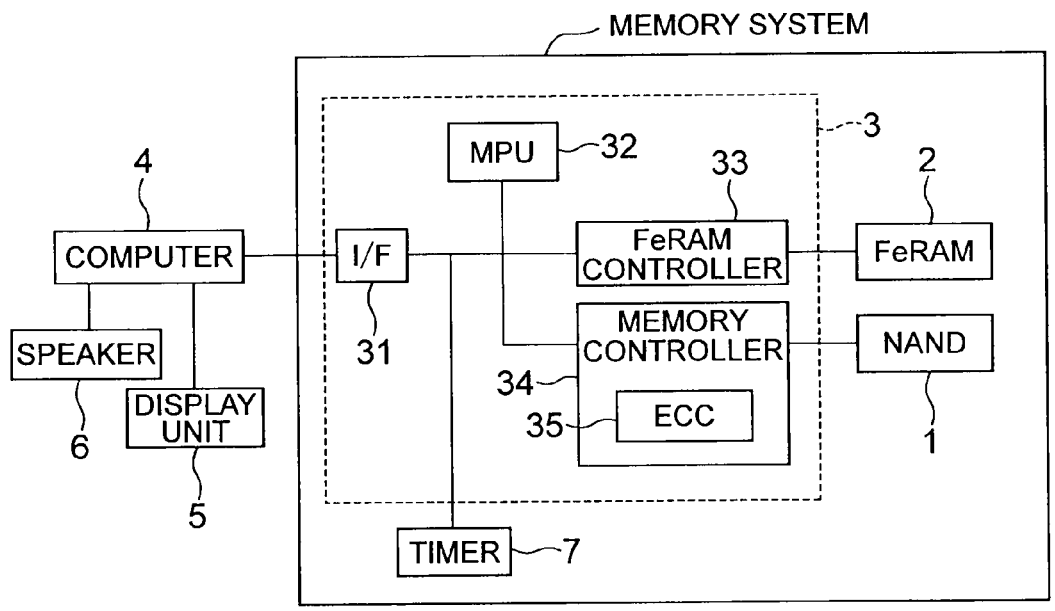
FIG. 5 is a schematic configuration diagram of a memory system according to a second embodiment of the present invention.

FIG. 5 shows a schematic configuration of a memory system according to the second embodiment of the present invention. This memory system is configured to further include a timer 7 in addition to the memory system of the first embodiment shown in FIG. 1. The timer 7 measures an energization time of this memory system. The measured energization time is retained in the FeRAM 2.

Figure 6:
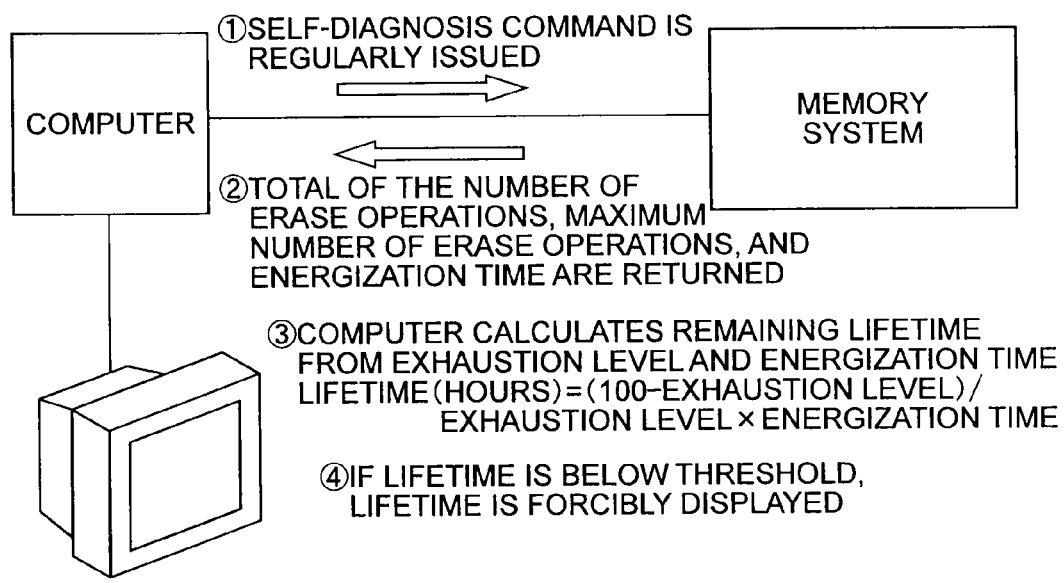
FIG. 6 is a diagram which illustrates each unit associated with exhaustion level calculation and alarm notification.

As shown in FIG. 6, a self-diagnosis command is regularly issued from the computer 4 to this memory system. The processing unit 32 receives the self-diagnosis command through the connection interface 31, and performs control to output a total of the number of erase operations, a maximum number of erase operations, and an energization time, and a remaining lifetime which are retained by the FeRAM 2 to the computer 4 through the connection interface 31. The remaining lifetime will be described later.

The computer 4 calculates an exhaustion level of the NAND type flash memory 1 based on the total of the number of erase operations and the maximum number of erase operations. Further, it calculates the remaining lifetime from the exhaustion level and the energization time. The exhaustion level is a ratio of the total of the number of erase operations to the maximum number of erase operations. A remaining lifetime is represented as (100−exhaustion level)/exhaustion level×energization time. For example, when maximum number of erase operations=1,000,000, total of the number of erase operations=990,000, and energization time=9,900 hours, remaining lifetime equals 100 hours.

Figure 7:
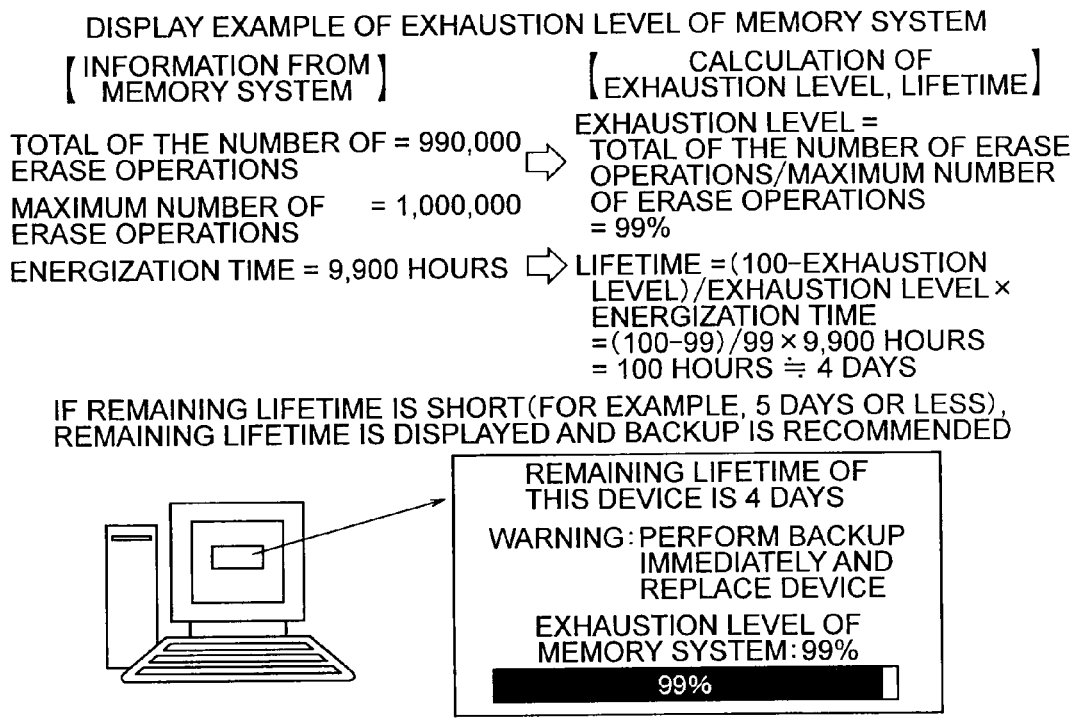
FIG. 7 is a diagram which shows one example of backup alarm display.

If the remaining lifetime is less than a predetermined threshold, the exhaustion level, the remaining lifetime, and a backup alarm are displayed on the display unit 5 as shown in FIG. 7 so that a user is notified of them. The exhaustion level is calculated and displayed in percentage, and the remaining lifetime is calculated and displayed in units of days. In addition, an alarm sound may be emitted from the speaker 6 to give notification to the user. In addition, the user can optionally display the exhaustion level and the remaining lifetime on the display unit 5.

Figure 8:
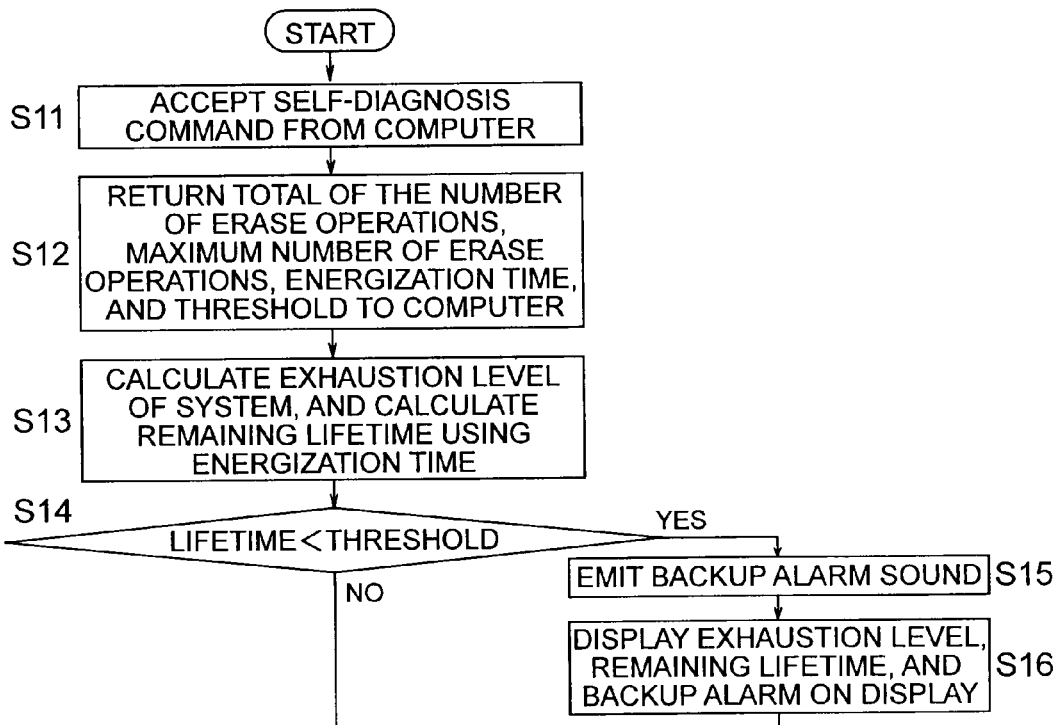
FIG. 8 is a diagram which shows a flow of exhaustion level calculation and notification to a user.

FIG. 8 shows a process flow of calculation of an exhaustion level and a lifetime of the NAND type flash memory 1 and notification of them to a user.

(Step S11) The processing unit 32 accepts a self-diagnosis command issued by the computer 4.

(Step S12) A total of the number of erase operations, the maximum number of erase operations, an energization time, and a threshold of a remaining lifetime are retrieved from the FeRAM 2 and outputted to the computer 4.

(Step S13) The exhaustion level and the remaining lifetime are calculated by the computer 4.

(Step S14) Whether or not the calculated remaining lifetime is less than the threshold is determined. If it is greater than or equal to the threshold, the process is terminated. If it is less than the threshold, the process proceeds to step S15.

(Step S15) A backup alarm sound is emitted from the speaker 6.

(Step S16) The exhaustion level, the remaining lifetime, and a backup alarm are displayed on the display unit 5.

In the above description, the exhaustion level is calculated from the total of the number of erase operations. However, since the number of erase operations in each block is averaged by wear leveling, an exhaustion level may be calculated from the number of erase operations in each block and a maximum number of erase operations.

In the NAND type flash memory 1, the numbers of rewrite operations are evenly distributed among blocks by wear leveling so that the number of rewrite operations with respect to a whole memory area is increased. A notification of an exhaustion level of the NAND type flash memory 1 can be provided to a user at any time. Backup is recommended when the exhaustion level exceeds a predetermined threshold and comes close to the end of a system lifetime, so that data loss can be prevented before it happens. Further, a remaining lifetime is displayed, so that the user can replace a memory system in an efficient way.

As described above, according to the memory system of the second embodiment, a memory state such as a remaining lifetime can be determined, and a memory can be efficiently used.

Third Embodiment

Figure 9:
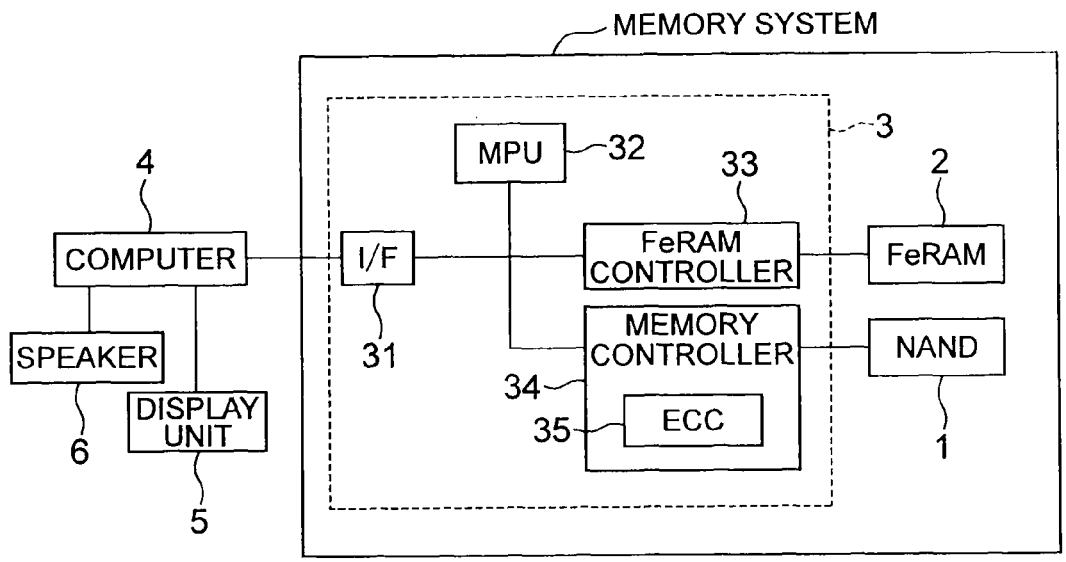
FIG. 9 is a schematic configuration diagram of a memory system according to a third embodiment of the present invention.

FIG. 9 shows a schematic configuration of a memory system according to the third embodiment of the present invention. The memory system has a configuration similar to the first embodiment shown in FIG. 1. In the memory system according to the first embodiment, an exhaustion level is calculated from a maximum number of erase operations and a total of the number of erase operations. However, in the present embodiment, an exhaustion level is calculated from an amount of writing into the NAND type flash memory 1 and an amount of reading therefrom.

The FeRAM 2 has a management table of a capacity of access to the NAND type flash memory 1, which retains an amount of writing, an amount of reading, and a threshold of an exhaustion level. In addition, it retains a limiting amount of writing of the NAND type flash memory 1. As used herein, a limiting amount of writing is defined as (a limiting number of store/erase operations in each block of the NAND type flash memory 1)×(a total capacity of the NAND type flash memory 1), multiplied by an efficiency of saving data as a weight, wherein the efficiency of saving data is an amount of erasing of the NAND type flash memory with respect to an amount of writing from the computer 4, and is predicted by simulation. The limiting amount of writing may have a margin to allow a minimum backup, startup, shutdown, and the like.

Figure 10:
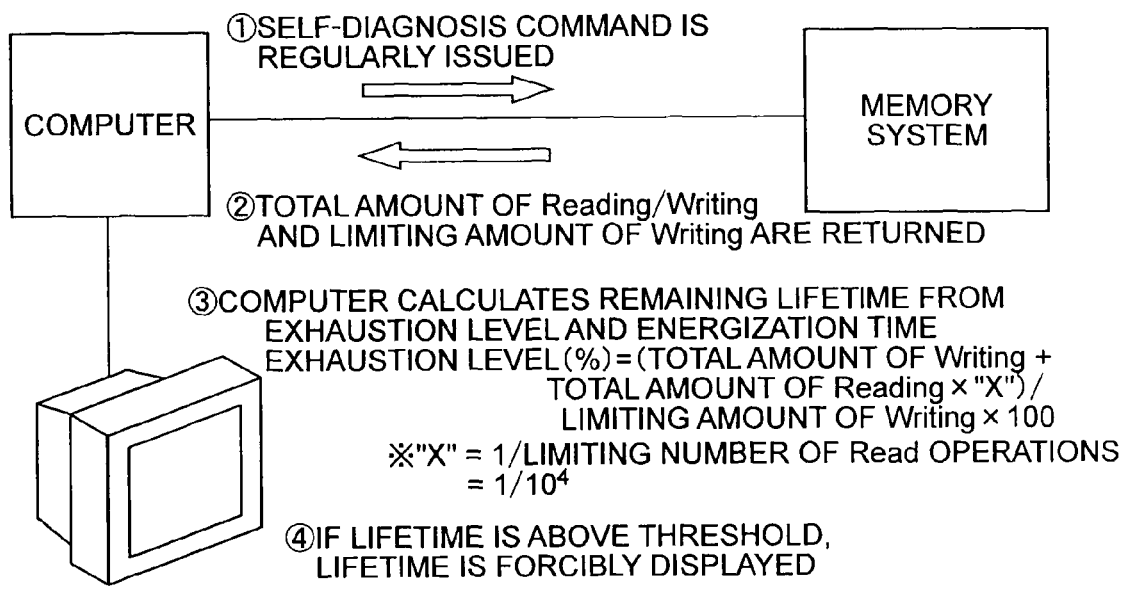
FIG. 10 is a diagram which illustrates each unit associated with exhaustion level calculation and alarm notification.

As shown in FIG. 10, a self-diagnosis command is regularly issued from the computer 4 to this memory system. The processing unit 32 receives the self-diagnosis command through the connection interface 31, and performs control to output an amount of writing, an amount of reading, a limiting amount of writing, and a threshold of exhaustion level which are retained by the FeRAM 2 to the computer 4 through the connection interface 31. The computer 4 calculates an exhaustion level of the NAND type flash memory 1 based on the amount of writing, the amount of reading, and the limiting amount of writing.

The exhaustion level (%) can be calculated as (amount of writing+amount of reading×"x")/limiting amount of writing× 100, wherein "x" is derived from the number of read operations by which read disturb occurs. For example, in a case where read disturb is caused by $10^4$ read operations, it is assumed that refresh occurs once with respect to an amount of reading which is a block capacity×$10^4$, and thus "x" can be set to $10^{-4}$.

If this exhaustion level is greater than or equal to the threshold, the exhaustion level and a backup alarm are displayed on the display unit 5 as shown in FIG. 11 so that a user is notified of them. In addition, an alarm sound may be emitted from the speaker 6 to give notification to the user. In addition, the user can optionally display the exhaustion level on the display unit 5.

FIG. 12 shows a process flow of calculation of an exhaustion level of the NAND type flash memory 1 and notification of the exhaustion level to a user.

(Step S21) The processing unit 32 accepts a self-diagnosis command issued by the computer 4.

(Step S22) A limiting amount of writing, an amount of reading, an amount of writing, and a threshold of exhaustion level are retrieved from the FeRAM 2 and outputted to the computer 4.

(Step S23) The exhaustion level is calculated by the computer 4.

(Step S24) Whether or not the calculated exhaustion level is greater than the threshold is determined. If it is less than or equal to the threshold, the process is terminated. If it is greater than the threshold, the process proceeds to step S25.

(Step S25) The exhaustion level and a backup alarm are displayed on the display unit 5.

In the NAND type flash memory 1, the numbers of rewrite operations are evenly distributed among blocks by wear leveling so that the number of rewrite operations with respect to a whole memory area is increased. A notification of an exhaustion level of the NAND type flash memory 1 can be provided to a user at any time. Backup is recommended when the exhaustion level exceeds a predetermined threshold and comes close to the end of a system lifetime, so that data loss can be prevented before it happens. Further, since refresh is also taken into account, the exhaustion level can be obtained more precisely.

As described above, according to the memory system of the third embodiment, a memory state such as an exhaustion level can be determined, and a memory can be efficiently used.

Although an exhaustion level is calculated using an amount of writing and an amount of reading in the present embodiment, an exhaustion level may be obtained from an amount of writing without use of an amount of reading.

Fourth Embodiment

FIG. 13 shows a schematic configuration of a memory system according to the fourth embodiment of the present invention. The memory system has a configuration similar to the first embodiment shown in FIG. 1. Although the memory system according to the first embodiment calculates an exhaustion level from the maximum number of erase operations and a total of the number of erase operations, and determines whether or not to display an alarm based on the exhaustion level, the number of error bits is considered in addition to an exhaustion level in the present embodiment.

The FeRAM 2 has a counter (not shown), and counts the number of erase operations of the NAND type flash memory 1 and retains a total of the number of erase operations. In addition, it retains a maximum number of erase operations and a threshold of exhaustion level of the NAND type flash memory 1. The maximum number of erase operations is obtained here from (limiting number of store/erase operations in each block of the NAND type flash memory 1)×(total number of blocks of the NAND type flash memory 1). In addition, the number of error bits in each block is managed, and the number of error bits in a block having a maximum number of error bits and a threshold of the number of error bits are retained. Since in the NAND type flash memory 1, wear leveling is performed such that the number of write operations in each block is averaged, the number of error bits to be retained may be the number of error bits in any block.

A self-diagnosis command is regularly issued from the computer 4 to this memory system. The processing unit 32 receives the self-diagnosis command through the connection interface 31, and performs control to output a total of the number of erase operations, a maximum number of erase operations, the number of error bits, and each threshold which are retained by the FeRAM 2 to the computer 4 through the connection interface 31. The computer 4 calculates an exhaustion level of the NAND type flash memory 1 based on the total of the number of erase operations and the maximum number of erase operations.

If this exhaustion level is greater than or equal to a predetermined threshold and the number of error bits is greater than or equal to a predetermined threshold, the exhaustion level, a backup alarm, and a message to the effect that many errors have occurred are displayed on the display unit 5 as shown in FIG. 14(a) so that a user is notified of them. As shown in FIG. 14(b), only the exhaustion level and the backup alarm may be displayed. Further, a degree of forcing of a backup alarm to be displayed may be increased in a stepwise manner depending on the case of "exhaustion level>threshold" or the case of "exhaustion level>threshold && the number of bits>threshold". Further, an alarm sound may be emitted from the speaker 6 to give notification to the user.

Figure 15:
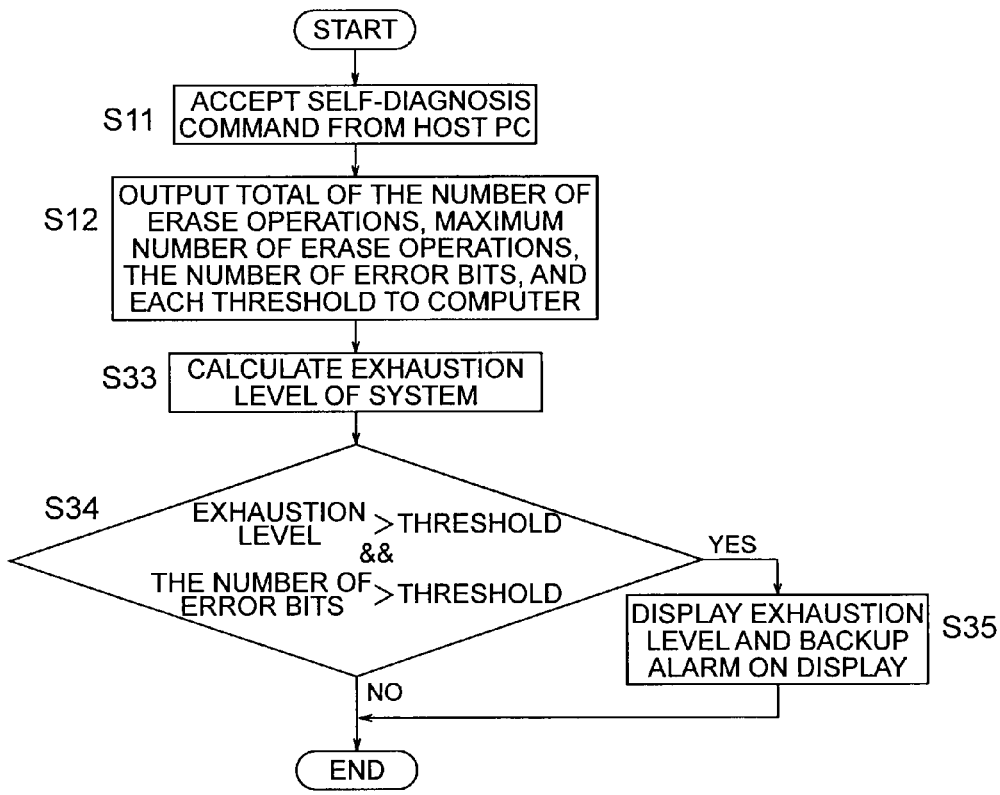
FIG. 15 is a diagram which shows a flow of exhaustion level calculation and notification to a user.

FIG. 15 shows a process flow of calculation of an exhaustion level of the NAND type flash memory 1 and notification of the exhaustion level to a user.

(Step S31) The processing unit 32 accepts a self-diagnosis command issued by the computer 4.

(Step S32) A total of the number of erase operations, the maximum number of erase operations, the number of error bits, and thresholds are retrieved from the FeRAM 2 and outputted to the computer 4.

(Step S33) The exhaustion level is calculated by the computer 4.

(Step S34) Whether or not the calculated exhaustion level is greater than a predetermined threshold and whether or not the number of error bits is greater than a predetermined threshold are determined. If both the exhaustion level and the number of error bits are greater than their thresholds, the process proceeds to step S35. If at least one of them is less than or equal to its threshold, the process is terminated.

(Step S35) The exhaustion level and a backup alarm are displayed on the display unit 5.

In the above description, the exhaustion level is calculated from the total of the number of erase operations. However, since the number of erase operations in each block is averaged by wear leveling, an exhaustion level may be calculated from the number of erase operations in each block and a maximum number of erase operations.

The number of error bits in each block of the NAND type flash memory 1 may be monitored and retained in the FeRAM 2, the number of blocks in which the number of error bits exceeds a predetermined threshold may be obtained by the computer 4, and a degree of forcing of a backup alarm to be displayed may be increased in a stepwise manner according to the obtained number of blocks.

In the NAND type flash memory 1, the numbers of rewrite operations are evenly distributed among blocks by wear leveling so that the number of rewrite operations with respect to a whole memory area is increased. A notification of an exhaustion level of the NAND type flash memory 1 can be provided to a user at any time. Backup is recommended when the exhaustion level exceeds a predetermined threshold and comes close to the end of a system lifetime, so that data loss can be prevented before it happens. Further, since the number of error bits is also taken into account, timing for backup can be obtained more precisely.

As described above, according to the memory system of the fourth embodiment, a memory state such as an exhaustion level can be determined, and a memory can be efficiently used.

Fifth Embodiment

Figure 16:
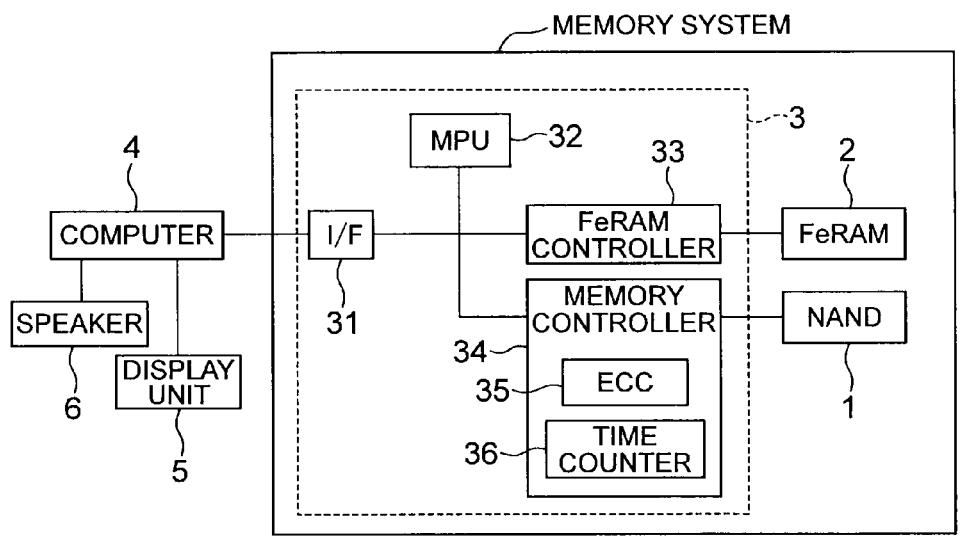
FIG. 16 is a schematic configuration diagram of a memory system according to a fifth embodiment of the present invention.

FIG. 16 shows a schematic configuration of a memory system according to the fifth embodiment of the present invention. This memory system is configured to further include a time counter 36 provided in the memory controller 34 of the memory system of the first embodiment shown in FIG. 1. The time counter 36 measures times required for storing/erasing in the NAND type flash memory 1 (which are referred to as "$t_{PROG}$" and "$t_{ERASE}$" respectively). The measured "$t_{PROG}$" and "$t_{ERASE}$" are retained in the FeRAM 2.

During a store (erase) operation of the NAND type flash memory, a verify operation for verifying whether data has been written or not is performed after data is stored (erased). If data has been incorrectly written, store (erase)/verify operations are repeated so that correct data is written. As a fatigue level of the NAND type flash memory increases (an exhaustion level increase), the number of store (erase)/verify operations increases, and with it, "$t_{PROG}$" ("$t_{ERASE}$") increases. In the present embodiment, these "$t_{PROG}$" and "$t_{ERASE}$" are taken into account in addition to an exhaustion level.

A self-diagnosis command is regularly issued from the computer 4 to this memory system. The processing unit 32 receives the self-diagnosis command through the connection interface 31, and performs control to output a total of the number of erase operations, a maximum number of erase operations, a storing time ("$t_{PROG}$"), an erasing time ("$t_{ERASE}$"), and each threshold which are retained by the FeRAM 2 to the computer 4 through the connection interface 31. The computer 4 calculates an exhaustion level of the NAND type flash memory 1 based on the total of the number of erase operations and the maximum number of erase operations.

Figure 17:
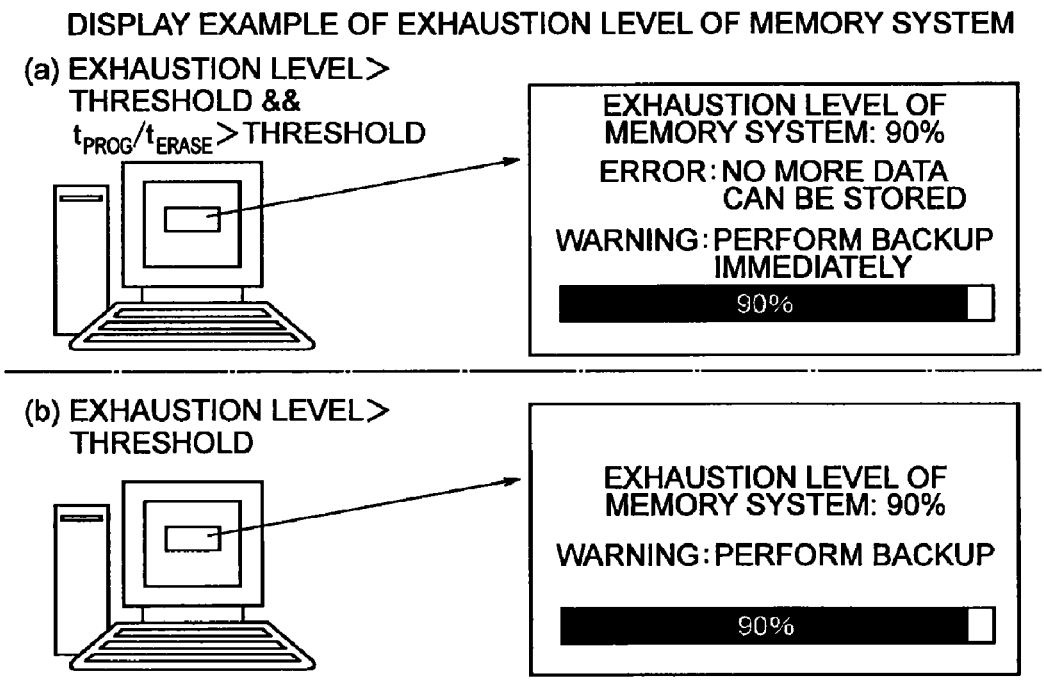
FIG. 17 is a diagram which shows one example of backup alarm display.

If this exhaustion level is greater than or equal to a predetermined threshold, and the storing time ("$t_{PROG}$") and the erasing time ("$t_{ERASE}$") are greater than or equal to respective predetermined thresholds, the exhaustion level, a backup alarm, and an error are displayed on the display unit 5 as shown in FIG. 17(a) so that a user is notified of them. As shown in FIG. 17(b), only the exhaustion level and the backup alarm may be displayed. Further, a degree of forcing of a backup alarm to be displayed may be increased in a stepwise manner depending on the case of "exhaustion level>threshold" or the case of "exhaustion level>threshold && $t_{PROG}$"/"$t_{ERASE}$">threshold". Further, an alarm sound may be emitted from the speaker 6 to give notification to the user.

Figure 18:
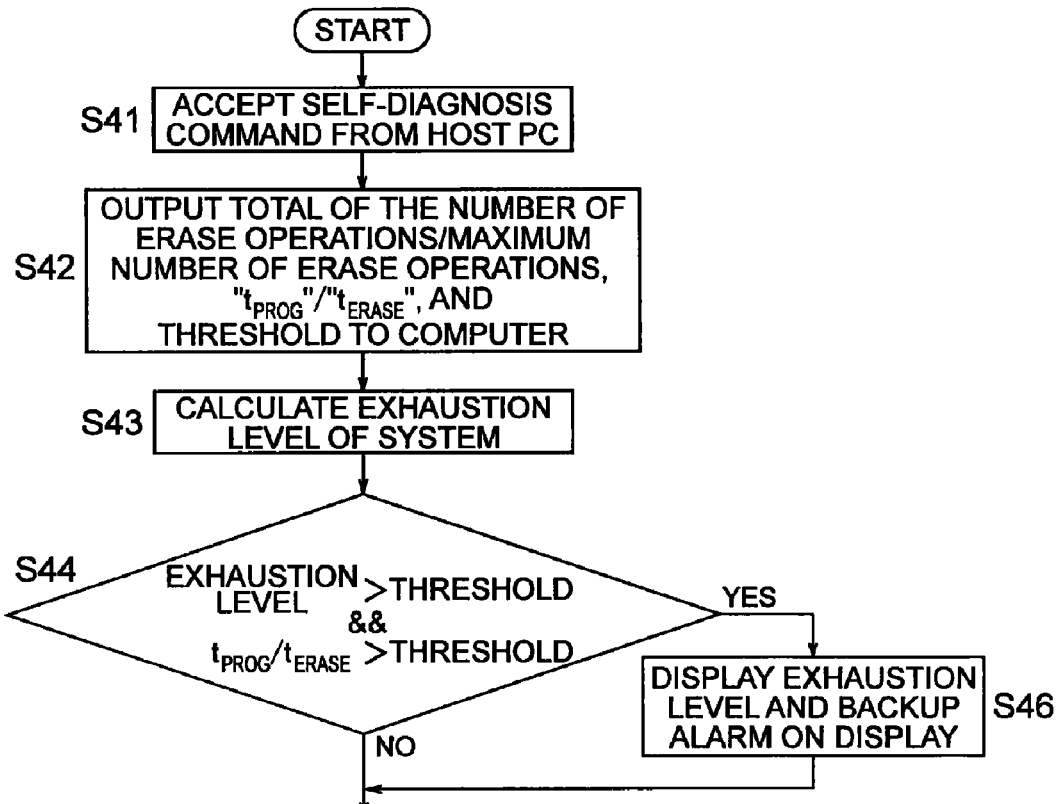
FIG. 18 is a diagram which shows a flow of exhaustion level calculation and notification to a user.

FIG. 18 shows a process flow of calculation of an exhaustion level of the NAND type flash memory 1 and notification of the exhaustion level to a user.

(Step S41) The processing unit 32 accepts a self-diagnosis command issued by the computer 4.

(Step S42) A total of the number of erase operations, the maximum number of erase operations, a storing/erasing time ("$t_{PROG}$"/"$t_{ERASE}$"), and thresholds are retrieved from the FeRAM 2 and outputted to the computer 4.

(Step S43) The exhaustion level is calculated by the computer 4.

(Step S44) Whether or not the calculated exhaustion level is greater than a predetermined threshold and whether or not the storing/erasing time ("$t_{PROG}$"/"$t_{ERASE}$") is greater than a predetermined threshold are determined. If both the exhaustion level and the storing/erasing time ("$t_{PROG}$"/"$t_{ERASE}$") are greater than their thresholds, the process proceeds to step S45. If at least one of them is less than or equal to its threshold, the process is terminated.

(Step S45) The exhaustion level and a backup alarm are displayed on the display unit 5.

It has been described that the exhaustion level is calculated from the total of the number of erase operations. However, since the number of erase operations in each block is averaged by wear leveling, an exhaustion level may be calculated from the number of erase operations in each block and a maximum number of erase operations.

In the NAND type flash memory 1, the numbers of rewrite operations are evenly distributed among blocks by wear leveling so that the number of rewrite operations with respect to a whole memory area is increased. A notification of an exhaustion level of the NAND type flash memory 1 can be provided to a user at any time. Backup is recommended when the exhaustion level exceeds a predetermined threshold and comes close to the end of a system lifetime, so that data loss can be prevented before it happens. Further, since a time required for the verify operation is also taken into account, timing for backup can be obtained more precisely.

As described above, according to the memory system of the fifth embodiment, a memory state such as an exhaustion level can be determined, and a memory can be efficiently used.

Figure 19:
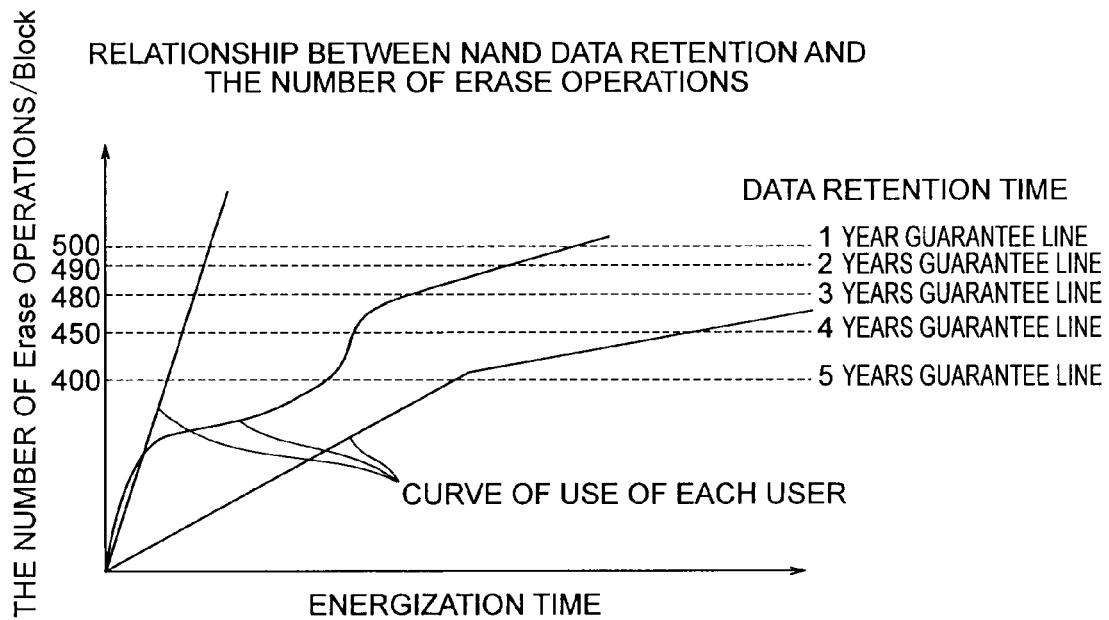
FIG. 19 is a graph which shows a relationship between the number of erase operations and data retention period.
Figure 20:
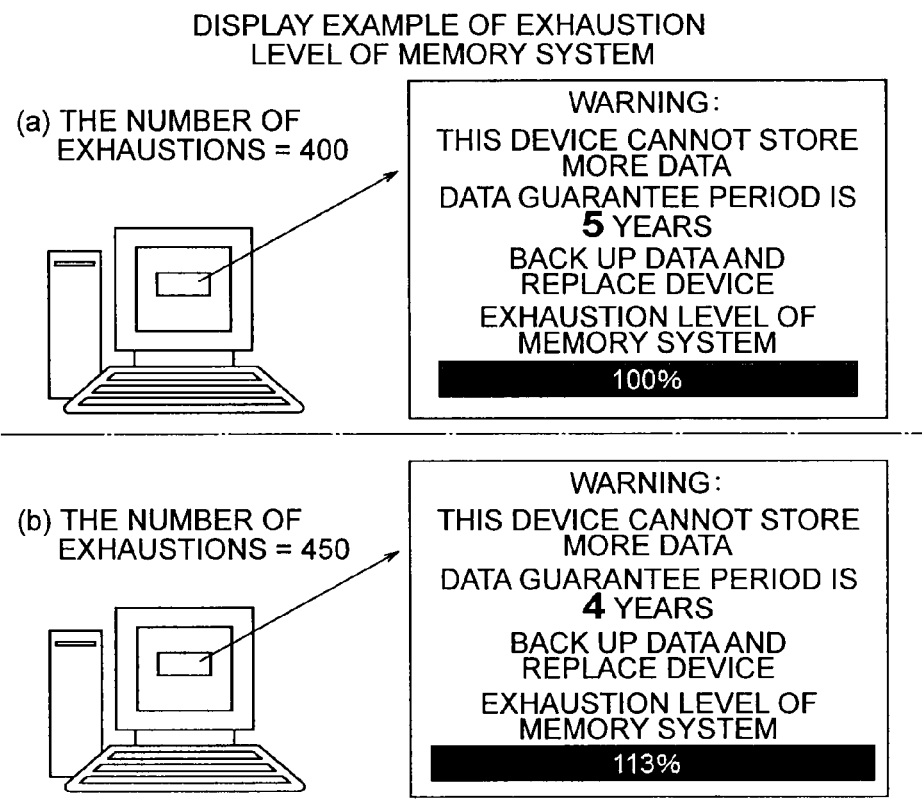
FIG. 20 is a diagram which shows one example of backup alarm display.

Any of the above described embodiments is just one example, and should not be considered to be restrictive. For example, when the number of erase operations of the NAND type flash memory 1 exceeds a limiting number of erase operations, a notification of a data retention period (a data guarantee period) may be provided to a user. As shown in FIG. 19, a data retention period based on the number of erase operations is determined from characteristics of the NAND type flash memory, and is retained in the FeRAM 2. When the number of erase operations in each block of the NAND type flash memory 1 which is being monitored by the FeRAM 2 becomes 400, the data guarantee period passes over a line of five years, and therefore the computer 4 displays the data guarantee period and a backup alarm on the display unit 5 as shown in FIG. 20(a) so that a user is notified of them. When the number of erase operations becomes 450 after further writing, the data guarantee period passes over a line of four years, and therefore the data guarantee period is made shorter and displayed as four years as shown in FIG. 20(b) so that the user is notified of it. Thereby, a notification that possibility of data loss has been increased is provided to the user, and reliability of the memory system can be improved. Although it has been described that a data guarantee period according to the number of erase operations in each block is displayed, a data guarantee period may be displayed based on a total of the number of erase operations.

Figure 21:
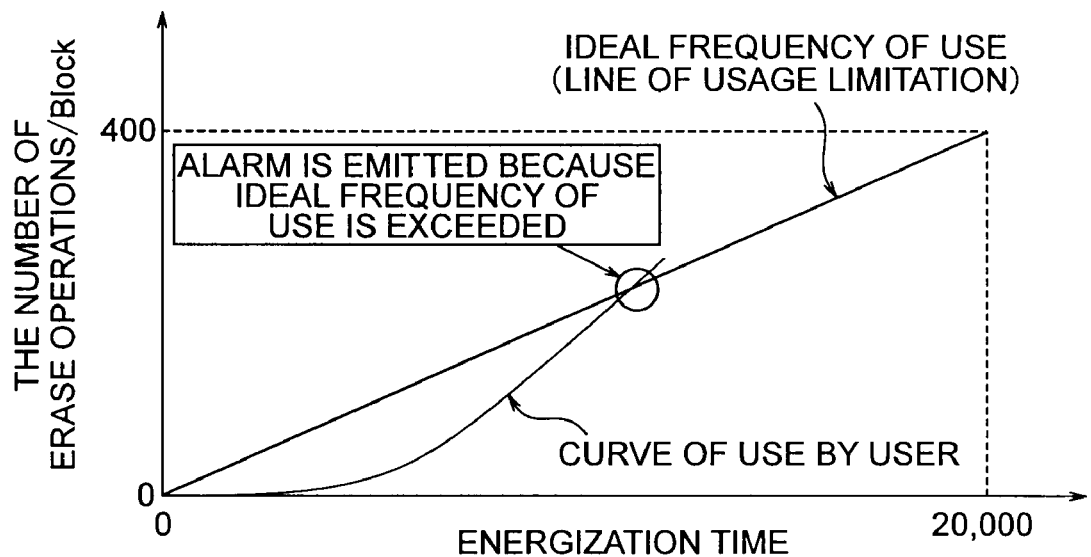
FIG. 21 is a graph which shows an ideal frequency of use.

Further, in the second embodiment, an ideal frequency of use which is determined from a maximum energization time and a limiting number of store/erase operations as shown in FIG. 21 may be compared with a user's frequency of use, and a notification that the memory has been used to an excessive degree may be provided to the user when the user's frequency of use exceeds the ideal frequency of use. The number of erase operations in each block, a maximum number of erase operations, a present energization time, and a maximum energization time are retained in the FeRAM 2, and are outputted to the computer 4 when a self-diagnosis command is accepted. The number of write operations are varied depending on blocks, because an amount of writing is increased due to initialization and the like in an early use stage, or the numbers of write operations are not yet completely distributed in an even manner among blocks by wear leveling. For this reason, an alarm is not displayed even if an ideal frequency of use is exceeded when a total of the number of erase operations is small, and an alarm is displayed, for example, when the total of the number of erase operations becomes half or more of the limiting number of store/erase operations.

In the fourth and fifth embodiments, an exhaustion level based on a total of the number of erase operations is calculated, but an exhaustion level based on an amount of writing and an amount of reading may be calculated as described in the third embodiment.

The nonvolatile memory 2 in the memory system of the above described embodiments may be an MRAM, a PRAM, or an RRAM instead of the FeRAM. Or, it may be composed of a DRAM or SRAM, which is a volatile memory. However, if it is composed of a volatile memory, management information needs to be saved in the NAND type flash memory 1, which is a nonvolatile memory, each time the memory system is powered off.

A self-diagnosis command may be issued every time the computer 4 is started up.

The invention claimed is:

1. A memory system comprising:
   a first memory in which data can be electrically written/erased;
   a nonvolatile second memory which is random access memory and counts the number of erase operations of the first memory and retains the number of erase operations and a maximum number of erase operations of the first memory;
   a controller which is connected to be given a self-diagnosis command from an outside through a connection interface, and which retrieves the number of erase operations and the maximum number of erase operations from the second memory based on the self-diagnosis command and outputs the number of erase operations and the maximum number of erase operations to the outside through the connection interface; and
   a time counter which measures a total time required for writing data in the first memory,
   wherein the nonvolatile second memory retains the number of erase operations, the maximum number of erase operations, and the time required for writing the data,
   the controller outputs the number of erase operations, the maximum number of erase operations, and the time required for writing the data based on the self-diagnosis command, and
   the time counter measures total time required for a store operation of the first memory and a verify operation for verifying whether data has been written, when the store operation and the verify operation are repeated.

2. The memory system according to claim 1, wherein the second memory retains a threshold of an exhaustion level obtained by division of the number of erase operations by the maximum number of erase operations, and the controller outputs the number of erase operations, maximum number of erase operations, and the threshold based on the self-diagnosis command.

3. The memory system according to claim 1, wherein the second memory retains data guarantee period information of the first memory corresponding to the number of erase operations, and the controller outputs the number of erase operations, the maximum number of erase operations, and the data guarantee period information based on the self-diagnosis command.

4. The memory system according to claim 1, further comprising:
   a timer which measures an energization time,
   wherein the second memory retains the number of erase operations, the maximum number of erase operations, and a present energization time, and the controller outputs the number of erase operations, the maximum number of erase operations, and the present energization time based on the self-diagnosis command, the present energization time representing a total time at which the first memory has been energized.

5. The memory system according to claim 4, wherein the second memory further retains a maximum energization time of the first memory, and the controller outputs the number of erase operations, the maximum number of erase operations, the present energization time, and the maximum energization time based on the self-diagnosis command.

6. The memory system according to claim 1, wherein the second memory retains the number of error bits in a memory block having a maximum number of error bits among a plurality of memory blocks included in the first memory, and the controller outputs the number of erase operations, the maximum number of erase operations, and the number of error bits based on the self-diagnosis command.

7. The memory system according to claim 1, wherein the second memory retains the number of error bits in at least one of a plurality of memory blocks included in the first memory, and the controller outputs the number of erase operations, the maximum number of erase operations, and the number of error bits based on the self-diagnosis command.

8. The memory system according to claim 7, wherein the second memory retains a threshold of the number of error bits, and the controller outputs the number of erase operations, the maximum number of erase operations, the number of error bits, and the threshold based on the self-diagnosis command.

9. The memory system according to claim 1, wherein the second memory retains a threshold of the time required for writing the data, and the controller outputs the number of erase operations, the maximum number of erase operations, the time required for writing the data, and the threshold based on the self-diagnosis command.

10. A memory system comprising:
a first memory in which data can be electrically written/erased;
a nonvolatile second memory which is random access memory and counts the number of erase operations of the first memory and retains the number of erase operations and a maximum number of erase operations of the first memory;
a controller which is connected to be given a self-diagnosis command from an outside through a connection interface, and which retrieves the number of erase operations and the maximum number of erase operations from the second memory based on the self-diagnosis command and outputs the number of erase operations and the maximum number of erase operations to the outside through the connection interface; and
a time counter which measures a total time required for writing data in the first memory,
wherein the second memory retains the number of erase operations, the maximum number of erase operations, and the time required for writing the data,
the controller outputs the number of erase operations, the maximum number of erase operations, and the time required for writing the data based on the self-diagnosis command, and
the time counter measures total time required for a erase operation of the first memory and a verify operation for verifying whether erase data has been written, when the erase operation and the verify operation are repeated.

11. The memory system according to claim 10, wherein the second memory retains a threshold of an exhaustion level obtained by division of the number of erase operations by the maximum number of erase operations, and the controller outputs the number of erase operations, maximum number of erase operations, and the threshold based on the self-diagnosis command.

12. The memory system according to claim 10, wherein the second memory retains data guarantee period information of the first memory corresponding to the number of erase operations, and the controller outputs the number of erase operations, the maximum number of erase operations, and the data guarantee period information based on the self-diagnosis command.

13. The memory system according to claim 10, further comprising:
a timer which measures an energization time,
wherein the second memory retains the number of erase operations, the maximum number of erase operations, and a present energization time, and the controller outputs the number of erase operations, the maximum number of erase operations and the present energization time based on the self-diagnosis command, the present energization time representing a total time at which the first memory has been energized.

14. The memory system according to claim 13, wherein the second memory further retains a maximum energization time of the first memory, and the controller outputs the number of erase operations, the maximum number of erase operations, the present energization time, and the maximum energization time based on the self-diagnosis command.

15. The memory system according to claim 10, wherein the second memory retains the number of error bits in a memory block having a maximum number of error bits among a plurality of memory blocks included in the first memory, and the controller outputs the number of erase operations, the maximum number of erase operations, and the number of error bits based on the self-diagnosis command.

16. The memory system according to claim 10, wherein the second memory retains the number of error bits in at least one of a plurality of memory blocks included in the first memory, and the controller outputs the number of erase operations, the maximum number of erase operations, and the number of error bits based on the self-diagnosis command.

17. The memory system according to claim 16, wherein the second memory retains a threshold of the number of error bits, and the controller outputs the number of erase operations, the maximum number of erase operations, the number of error bits, and the threshold based on the self-diagnosis command.

18. The memory system according to claim 10, wherein the second memory retains a threshold of the time required for writing the data, and the controller outputs the number of erase operations, the maximum number of erase operations, the time required for writing the data, and the threshold based on the self-diagnosis command.

* * * * *